(12) United States Patent
Taniguchi

(10) Patent No.: US 7,425,879 B2
(45) Date of Patent: Sep. 16, 2008

(54) SURFACE ACOUSTIC WAVE FILTER APPARATUS AND BRANCHING FILTER

(75) Inventor: Norio Taniguchi, Otsu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 115 days.

(21) Appl. No.: 11/621,642

(22) Filed: Jan. 10, 2007

(65) Prior Publication Data

US 2007/0159269 A1 Jul. 12, 2007

(30) Foreign Application Priority Data

Jan. 12, 2006 (JP) .............................. 2006-004611

(51) Int. Cl.
*H01L 41/00* (2006.01)
*H03H 9/00* (2006.01)
(52) U.S. Cl. .................... 333/133; 333/193; 333/195
(58) Field of Classification Search .................. None
See application file for complete search history.

(56) References Cited

U.S. PATENT DOCUMENTS

| | | | | |
|---|---|---|---|---|
| 5,963,114 A | * | 10/1999 | Ueda et al. .................. 333/195 |
| 6,720,842 B2 | * | 4/2004 | Sawada ....................... 333/133 |
| 6,744,333 B2 | | 6/2004 | Sawada | |
| 6,771,144 B2 | | 8/2004 | Takamine | |
| 6,876,275 B2 | | 4/2005 | Ouchi | |
| 6,891,451 B2 | | 5/2005 | Sawada | |
| 7,135,944 B2 | | 11/2006 | Iwamoto et al. | |

FOREIGN PATENT DOCUMENTS

| | | |
|---|---|---|
| JP | 2001-308672 A | 11/2001 |
| JP | 2002-314371 A | 10/2002 |
| JP | 2003-249842 A | 9/2003 |
| JP | 2003-324335 A | 11/2003 |
| JP | 2004-048675 A | 2/2004 |

\* cited by examiner

*Primary Examiner*—Anh Q Tran
(74) *Attorney, Agent, or Firm*—Keating & Bennett, LLP

(57) ABSTRACT

In a longitudinally coupled resonator SAW filter apparatus, one end of each N first longitudinally coupled resonator SAW filter, where N is an integer equal to or greater than 2, is connected in parallel to an unbalanced signal terminal, the first N longitudinally coupled resonator SAW filters are connected in a cascade arrangement to M second longitudinally coupled resonator SAW filters, where M is an integer equal to or greater than 1, the M second longitudinally coupled resonator SAW filter are connected to first and second balanced signal terminals, and N and M are selected such that N>M.

12 Claims, 11 Drawing Sheets

SURFACE ACOUSTIC WAVE FILTER APPARATUS AND BRANCHING FILTER

BACKGROUND OF THE INVENTION

1. Field of the Invention

The present invention relates to a surface acoustic wave filter apparatus for use as a bandpass filter and a branching filter including the surface acoustic wave filter apparatus, and more particularly, to a surface acoustic wave filter apparatus including a plurality of cascade-connected longitudinally coupled resonator SAW filters, and a branching filter including the surface acoustic wave filter apparatus.

2. Description of the Related Art

A surface acoustic wave filter is commonly used as a bandpass filter in mobile communication devices such as portable telephone devices, and is also used for various types of branching filters.

Japanese Unexamined Patent Application Publication No. 2003-249842 discloses a branching filter using a double-mode resonator type surface acoustic wave filter. FIG. 10 is a plan view schematically showing the structure of the branching filter disclosed in Japanese Unexamined Patent Application Publication No. 2003-249842.

The branching filter 501 includes a common terminal 502 for connection to an antenna, a transmitting terminal 503, and a receiving terminal 504. A first SAW (surface acoustic wave) filter apparatus 505 is connected between the common terminal 502 and the transmitting terminal 503, and a second SAW filter apparatus 506 is connected between the common terminal 502 and the receiving terminal 504.

In the SAW filter apparatus 505, a plurality of SAW resonators are connected so as to define a ladder circuit. On the other hand, the SAW filter apparatus 506 includes first and second SAW filters 507 and 508. The SAW filters 507 and 508 are 3-IDT resonator type SAW filters. Of the three IDTs (interdigital transducers) of each of the SAW filters 507 and 508, IDTs at the central location are commonly connected to the common terminal 502. One end of each of the IDTs at outer locations of the SAW filters 507 and 508 is commonly connected to the first receiving terminal 504. The other end of each of IDTs at outer locations of the SAW filters 507 and 508 is commonly connected to the second receiving terminal 509. The phase of a signal transmitted from the SAW filters 507 and 508 to the first receiving terminal 504 and the phase of a signal transmitted from the SAW filters 507 and 508 to the second receiving terminal 509 are different by 180° so that the SAW filter 506 has an unbalanced-to-balanced conversion function.

In the branching filter 501 disclosed in Japanese Unexamined Patent Application Publication No. 2003-249842, the SAW filter apparatus 506 in the receiving circuit is configured such that the two SAW filters 507 and 508 are connected together in parallel. This reduces insertion loss and improves the maximum allowable power.

Japanese Unexamined Patent Application Publication No. 2001-308672 discloses a SAW filter apparatus having a structure shown in FIG. 11. This SAW filter apparatus also has an unbalanced-to-balanced conversion function.

In this SAW filter apparatus 511, as shown in FIG. 11, SAW filters 515 to 517 are connected between an unbalanced signal terminal 512 and first and second balanced signal terminals 513 and 514. The SAW filter 515 includes IDTs 515a to 515c. One end of the IDT 515b at the central location is connected to the unbalanced signal terminal 512. One end of the IDT 515a is connected to the SAW filter 516, and one end of the IDT 515c is connected to the SAW filter 517. The SAW filters 516 and 517 are respectively connected to the first and second balanced signal terminals 513 and 514. In this SAW filter apparatus 511, to achieve an unbalanced-to-balanced conversion, the electrode structure is configured such that the phase of a signal flowing through the SAW filter 516 and the phase of a signal flowing through the SAW filter 517 are different by 180°.

In the SAW filter apparatus 501 disclosed in Japanese Unexamined Patent Application Publication No. 2003-249842 cited above, because a plurality of SAW filters 507 and 508 in the receiving SAW filter apparatus 506 are connected together in parallel, a piezoelectric substrate on which the SAW filters 507 and 508 are provided has a size large enough to accommodate these SAW filters 507 and 508 thereon, although it has the advantage that a reduction in the insertion loss in a passband and an improvement of maximum allowable power are achieved. That is, the total size of the SAW filter apparatus 506 increases, and thus, the total size of the branching filter 501 increases.

On the other hand, in the SAW filter apparatus 511 disclosed in Japanese Unexamined Patent Application Publication No. 2001-308672 cited above, although the unbalanced-to-balanced conversion is achieved, when the SAW filter 516 or the SAW filter 517 is used, for example, as a receiving filter of a branching filter in a portable telephone device, it is difficult to achieve high maximum allowable power.

SUMMARY OF THE INVENTION

To overcome the problems described above, preferred embodiments of the present invention provide a surface acoustic wave filter apparatus that achieves a high maximum allowable power without having to increase the size thereof, and a branching filter including the surface acoustic wave filter apparatus.

In a first preferred embodiment of the present invention, a surface acoustic wave filter apparatus includes a piezoelectric substrate, N first longitudinally coupled resonator SAW filters, where N is an integer equal to or greater than 2, each including at least two IDTs disposed on the piezoelectric substrate in a direction in which a surface acoustic wave propagates, and a pair of reflectors disposed on two respective sides, in the direction in which the surface acoustic wave propagates, of an area in which the at least two IDTs are disposed, and M second longitudinally coupled resonator SAW filters, where M is an integer equal to or greater than 1, each including at least two IDTs disposed on the piezoelectric substrate in the direction in which the surface acoustic wave propagates and a pair of reflectors disposed on two respective sides, in the direction in which the surface acoustic wave propagates, of an area in which the at least two IDTs are disposed, the first longitudinally coupled resonator SAW filters being connected in a cascade arrangement to the second longitudinally coupled resonator SAW filters. The surface acoustic wave filter apparatus further includes a unbalanced signal terminal and first and second balanced signal terminals, one end of each of the N first longitudinally coupled resonator SAW filters being connected to the unbalanced signal terminal, one end of each of the M second longitudinally coupled resonator SAW filters being connected to the first balanced signal terminal, the other end of each of the M second longitudinally coupled resonator SAW filters being connected to the second balanced signal terminal, N and M being selected such that N>M.

In a second preferred embodiment of the present invention, a surface acoustic wave filter apparatus includes a piezoelectric substrate, N first longitudinally coupled resonator SAW filters, where N is an integer equal to or greater than 2, each including at least two IDTs disposed on the piezoelectric substrate in a direction in which a surface acoustic wave propagates and a pair of reflectors disposed on two respective sides, in the direction in which the surface acoustic wave propagates, of an area in which the at least two IDTs are disposed, and M second longitudinally coupled resonator SAW filters as M, where M is an integer equal to or greater than 1, each including at least two IDTs disposed on the piezoelectric substrate in the direction in which the surface acoustic wave propagates and a pair of reflectors disposed on two respective sides, in the direction in which the surface acoustic wave propagates, of an area in which the at least two IDTs are disposed, the first longitudinally coupled resonator SAW filters being connected in a cascade arrangement to the second longitudinally coupled resonator SAW filters. The surface acoustic wave filter apparatus further includes an input signal terminal and an output signal terminal, the first longitudinally coupled resonator SAW filters being connected to the input signal terminal, the second longitudinally coupled resonator SAW filters being connected to the output signal terminal, N and M being selected such that N>M.

In the surface acoustic wave filter apparatus according to either of the first and second preferred embodiments described above, the surface acoustic wave filter apparatus may be a receiving filter in a branching filter. This makes it possible to provide a branching filter having a high maximum allowable power, high noise immunity, and a small size.

In the surface acoustic wave filter apparatus according to the first preferred embodiment, N may be an even number, and the first longitudinally coupled resonator SAW filters may include a first group including N/2 longitudinally coupled resonator SAW filters and a second group including N/2 longitudinally coupled resonator SAW filters, the phase of a signal output from the longitudinally coupled resonator SAW filter in the first group with respect to the phase of an input signal and the phase of a signal output from the longitudinally coupled resonator SAW filter in the second group with respect to the phase of an input signal may be different by 180°, and M may be 1, and the second longitudinally coupled resonator SAW filter may have first and second input nodes, the first input node being connected to an output node of the first group of longitudinally coupled resonator SAW filters, the second input node being connected to an output node of the second group of longitudinally coupled resonator SAW filters. This configuration improves the balance of the output characteristics.

In the surface acoustic wave filter apparatus, N may be selected to be equal to or greater than 4. This further increases the maximum allowable power.

In the surface acoustic wave filter apparatus, each first longitudinally coupled resonator SAW filter may include five IDTs, for example. Use of a 5-IDT type longitudinally coupled resonator SAW filters in the surface acoustic wave filter apparatus further increases the maximum allowable power.

In the surface acoustic wave filter apparatus, each second longitudinally coupled resonator SAW filter may include three IDTs, and, of these three IDTs, an IDT located at the central location may be divided, in the direction in which the surface acoustic wave propagates, into first and second sub-IDTs, and one end of the first sub-IDT may be electrically connected to one end of the second sub-IDT, the other end of the first sub-IDT may be connected to the first balanced signal terminal, and the other end of the second sub-IDT may be connected to the second balanced signal terminal. This configuration enables a further reduction in the size, and enables the use of an electrode layout suitable to achieve a reduction in the size.

In another preferred embodiment of the present invention, a branching filter includes a receiving filter defined by a surface acoustic wave filter apparatus according to a preferred embodiment of the present invention.

The various preferred embodiments of the present invention provide the following advantages.

In the surface acoustic wave filter apparatus according to a preferred embodiment of the present invention, N (N is an integer equal to or greater than 2) first longitudinally coupled resonator SAW filters are connected in a cascade fashion to M (M is an integer equal to or greater than 1) second longitudinally coupled resonator SAW filters, one end of each first longitudinally coupled resonator SAW filter is connected to the unbalanced signal terminal, one end of each second longitudinally coupled resonator SAW filter is connected to the first balanced signal terminal, the other end of each second longitudinally coupled resonator SAW filter is connected to the second balanced signal terminal, and N and M are selected such that N>M. This configuration achieves not only the unbalanced-to-balanced conversion but also a high maximum allowable power without having to increase the size of the surface acoustic wave filter apparatus.

More specifically, parallel connections of a plurality of first longitudinally coupled resonator SAW filters to the unbalanced signal terminal enables an increase in the maximum allowable power. Furthermore, in this configuration, the number of second longitudinally coupled resonator SAW filters connected to the first and second balanced signal terminals may be selected to be less than the number of first longitudinally coupled resonator SAW filters connected to the unbalanced signal terminal, and thus, it is possible to achieve an increase in the maximum allowable power without increasing the chip size.

In the surface acoustic wave filter apparatus according to another preferred embodiment of the present invention, N (N is an integer equal to or greater than 2) first longitudinally coupled resonator SAW filters are connected in a cascade arrangement to M (M is an integer equal to or greater than 1) second longitudinally coupled resonator SAW filters, the first longitudinally coupled resonator SAW filters are connected to the input signal terminal, the second longitudinally coupled resonator SAW filters are connected to the output signal terminal, and N and M are selected such that N>M. Thus, as in the first preferred embodiment, it is possible to increase the maximum allowable power without increasing the chip size.

In the branching filter according to another preferred embodiment of the present invention, the surface acoustic wave filter according to preferred embodiments of the present invention is preferably used as the receiving filter, and thus it possible to achieve a high maximum allowable power.

Other features, elements, characteristics and advantages of the present invention will become more apparent from the following detailed description of preferred embodiments of the present invention with reference to the attached drawings.

DETAILED DESCRIPTION OF THE PREFERRED EMBODIMENTS

The present invention is described in further detail below with reference to specific preferred embodiments in conjunction with the accompanying drawings.

Figure 1:
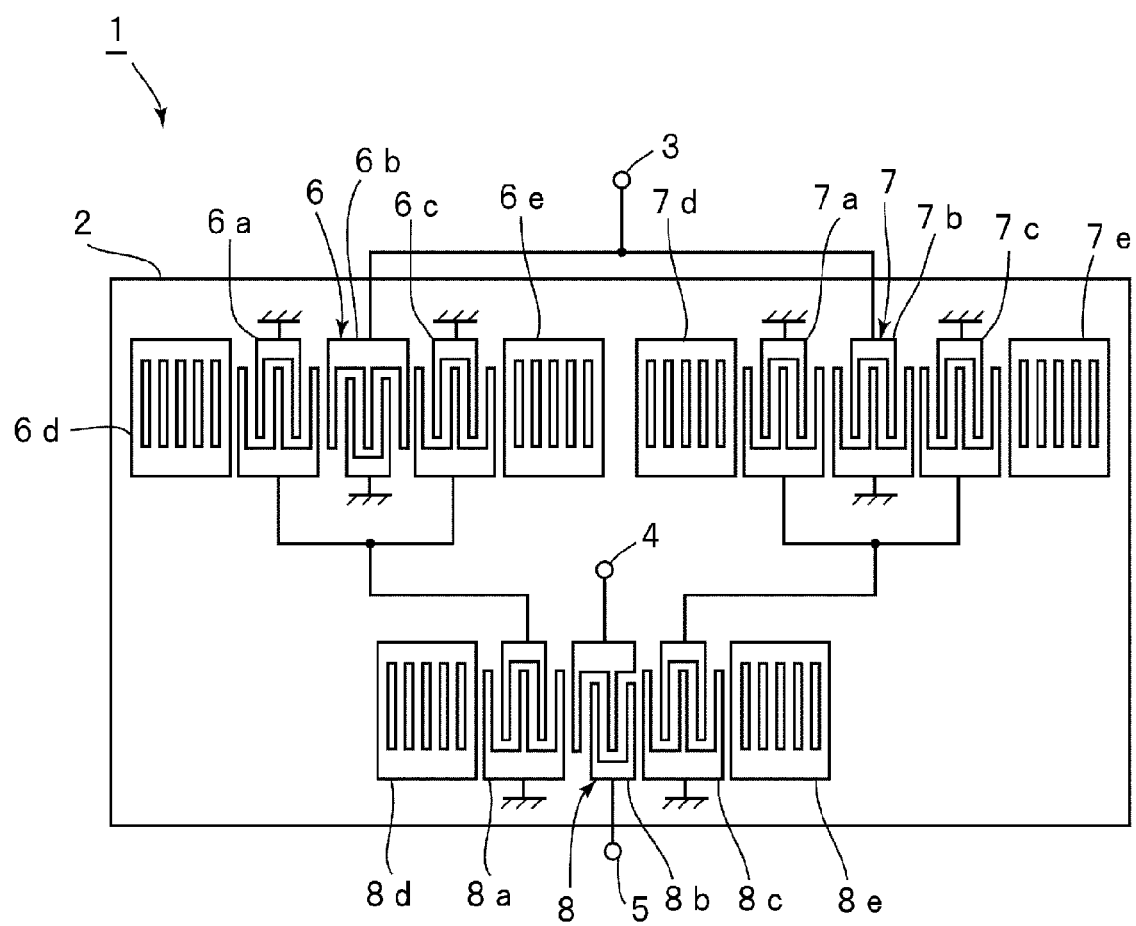
FIG. 1 is a plan view schematically showing a longitudinally coupled resonator SAW filter apparatus according to a preferred embodiment of the present invention.

FIG. 1 is a plan view schematically showing a surface acoustic wave filter apparatus according to a preferred embodiment of the present invention.

A surface acoustic wave filter apparatus 1 is designed for use as a receiving bandpass filter of a PCS portable telephone. For this purpose, the passband is designed to be 1903 MHz to 1990 MHz.

In the present preferred embodiment, the surface acoustic wave filter apparatus 1 includes a piezoelectric substrate 2. In the present preferred embodiment, by way of example, a 42°-rotated Y-cut X-propagation $LiTaO_3$ substrate is preferably used as the piezoelectric substrate 2. Alternatively, the piezoelectric substrate 2 may be made of other piezoelectric signal crystals with a particular crystal angle or a piezoelectric ceramic.

The surface acoustic wave filter apparatus 1 is produced by forming electrodes of a material primarily including aluminum on the piezoelectric substrate 2. FIG. 1 is a plan view schematically showing an example of the electrode structure.

The surface acoustic wave filter apparatus 1 includes an unbalanced signal terminal 3 defining an input terminal and first and second balanced signal terminals 4 and 5 defining output terminals. The electrode structure shown in FIG. 1 is connected between the unbalanced signal terminal 3 and the first and second balanced signal terminals 4 and 5.

More specifically, one end of each of two first longitudinally coupled resonator SAW filters 6 and 7 is commonly connected to the unbalanced signal terminal 3. Each of the longitudinally coupled resonator SAW filters 6 and 7 includes three IDTs 6a to 6c or 7a to 7c arranged in a direction in which a surface acoustic wave propagates. Reflectors 6d and 6e are disposed on respective sides, in the direction of surface acoustic wave propagation, of an area in which IDTs 6a to 6c are disposed. In addition, in an area in which the longitudinally coupled resonator SAW filter 7 is provided, reflectors 7d and 7e are arranged in a similar manner.

One end of the IDT 6b which is central one of the IDTs 6a to 6c and one end of the IDT 7b which is central one of the IDTs 7a to 7c are commonly connected to the unbalanced signal terminal 3. The other end of the IDT 6b and the other end of the IDT 7b are grounded.

The IDT 6b and the IDT 7b are configured so as to have opposite polarities so that a signal propagating from the IDT 6b to the IDTs 6a 6c and a signal propagating from the IDT 7b to the IDTs 7a and 7c are different in phase by 180°.

The first longitudinally coupled resonator SAW filters 6 and 7 are connected in a cascade arrangement to a second longitudinally coupled resonator SAW filter 8. Thus, in the present preferred embodiment, N=2 and M=1, for example.

The second longitudinally coupled resonator SAW filter 8 includes IDTs 8a to 8c arranged in the direction of surface acoustic wave propagation, and reflectors 8d and 8e are disposed on respective sides of an area in which the IDTs 8a to 8c are disposed. That is, the second longitudinally coupled resonator SAW filter 8 is also a 3-IDT resonator SAW filter.

One end of each of the IDTs 6a and 6c is grounded, and the other ends of the respective IDTs 6a and 6c are commonly connected to one end of the IDT 8a of the second longitudinally coupled resonator SAW filter 8.

One end of each of the IDTs 7a and 7c is grounded, and the other ends of the respective IDTs 7a and 7c are commonly connected to one end of the IDT 8c of the second longitudinally coupled resonator SAW filter 8.

The other end of the IDT 8a, opposite to the end connected to the IDTs 6a and 6c, is grounded. Similarly, the other end of the IDT 8c, opposite to the end connected to the IDTs 7a and 7c, is grounded. One end of the IDT 8b located at the center is connected to the first balanced signal terminal 4, and the other end is connected to the second balanced signal terminal 5.

In the configuration described above, an input signal is applied to the unbalanced signal terminal 3, and an output signal is obtained at the first and second balanced signal terminals 4 and 5.

In the present preferred embodiment, electrode structures of the longitudinally coupled resonator SAW filters 6 to 8 are designed such that the unbalanced signal terminal 3 has an input impedance substantially equal to about 50 Ω and the balanced signal terminals 4 and 5 defining output terminals have an output impedance substantially equal to about 150 Ω.

In the surface acoustic wave filter apparatus 1 according to the present preferred embodiment, as described above, if an input signal is applied to the unbalanced signal terminal 3, an output signal is obtained at the first and second balanced signal terminals 4 and 5. Thus, the surface acoustic wave filter apparatus 1 can be used as a bandpass filter with an unbalanced-to-balanced conversion function. The surface acoustic wave filter apparatus 1 also has an impedance conversion function. That is, the output impedance is set to be substantially equal to 150 Ω, which is substantially 3 times greater than the input impedance.

Furthermore, in the longitudinally coupled resonator SAW filter apparatus 1 according to the present preferred embodiment, the number, N, of first longitudinally coupled resonator SAW filters connected to the unbalanced signal terminal 3 is set to 2, that is, there are two first longitudinally coupled resonator SAW filters 6 and 7 connected to the unbalanced signal terminal 3. This configuration enables a significant increase in the maximum allowable power. This configuration also enables greater out-of-band attenuation than a longitudinally coupled resonator SAW filter apparatus according to a known technique can provide, as described below with reference to FIGS. 2 and 3.

Figure 2:
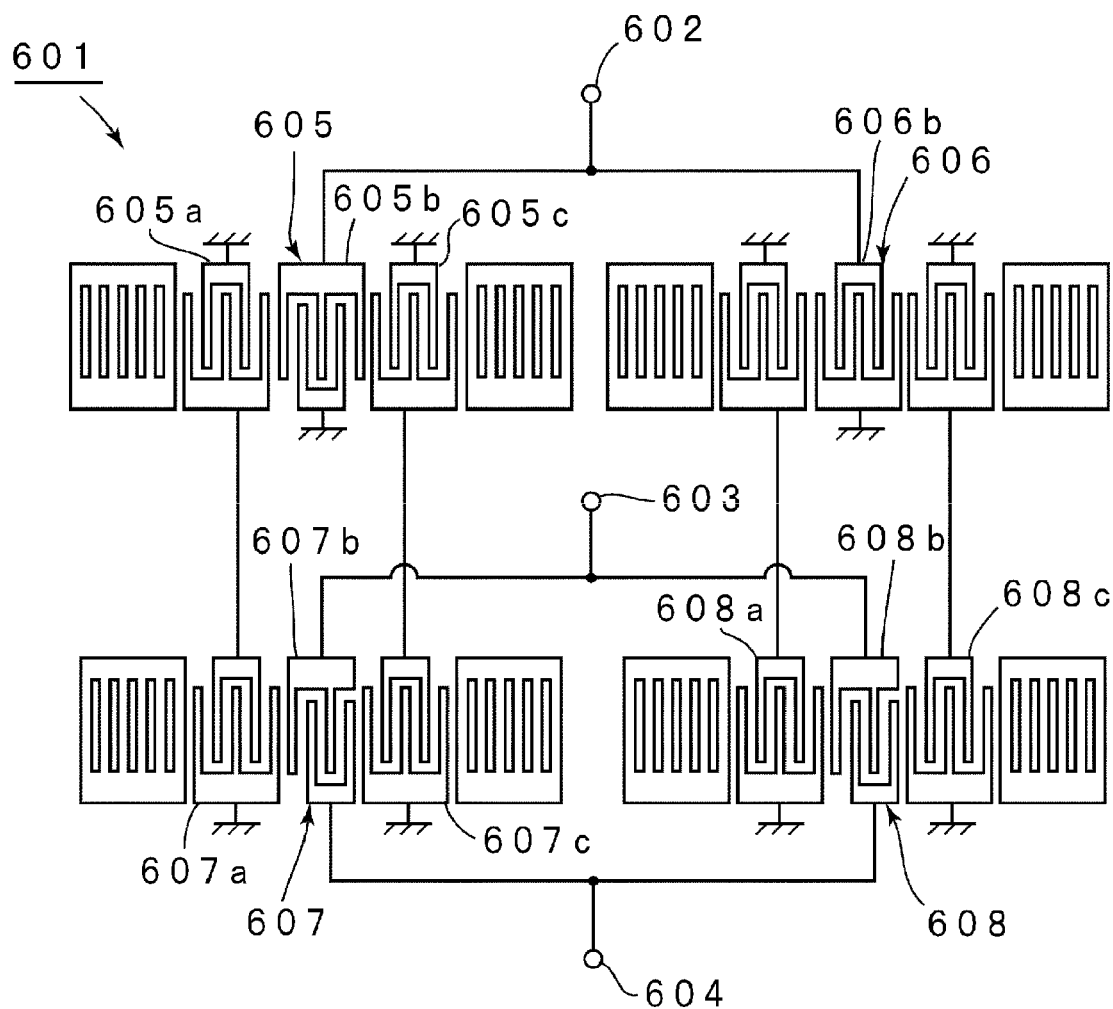
FIG. 2 is a plan view schematically showing, for the purpose of comparison, a circuit configuration of a longitudinally coupled resonator SAW filter according to a known technique.

FIG. 2 shows, as a comparative example, a longitudinally coupled resonator SAW filter apparatus 601. In this longitudinally coupled resonator SAW filter apparatus 601, an electrode structure is connected between an unbalanced signal terminal 602 and first and second balanced signal terminals 603 and 604. More specifically, two longitudinally coupled resonator SAW filters 605 and 606 are connected in parallel to the unbalanced signal terminal 602. The longitudinally coupled resonator SAW filters 605 and 606 are 3-IDT type longitudinally coupled resonator SAW filters in which central IDTs 605b and 606b are connected to the unbalanced signal terminal 602, and the IDTs 605b and 606b are configured so as to have opposite polarities.

The IDTs 605a and 605c are connected to IDTs 607a and 607c of a second longitudinally coupled resonator SAW filter 607. Similarly, the IDTs 606a and 606c are connected to IDTs 608a and 608c of another second longitudinally coupled resonator SAW filter 608. Each of the longitudinally coupled resonator SAW filters 607 and 608 is a 3-IDT type longitudinally coupled resonator SAW filter. One end of an IDT 607b and one end of an IDT 608b are commonly connected to the first balanced signal terminal 603, and the other ends of the IDTs 607b and 608b are commonly connected to the second balanced signal terminal 604.

In the surface acoustic wave filter apparatus 601, in an area in which the unbalanced signal terminal 602 defining the input terminal is disposed two longitudinally coupled resonator SAW filters 605 and 606 are connected together in parallel. In an area in which the first and second balanced signal terminals 603 and 604 defining the output terminals are disposed, two longitudinally coupled resonator SAW filters 607 and 608 are connected together in parallel. This structure enables an increase in maximum allowable power, and also enables an improvement in out-of-band attenuation characteristic. As can be clearly understood by comparing FIG. 1 with FIG. 2, a large number of electrodes must be provided in the output area, which results in an increase in the size of the piezoelectric substrate, and thus, an increase in the chip size.

In contrast, in the longitudinally coupled resonator SAW filter apparatus 1 according to the present preferred embodiment, a smaller number of longitudinally coupled resonator SAW filters are required in the output area, and thus, a reduction in the chip size is achieved.

Figure 3:
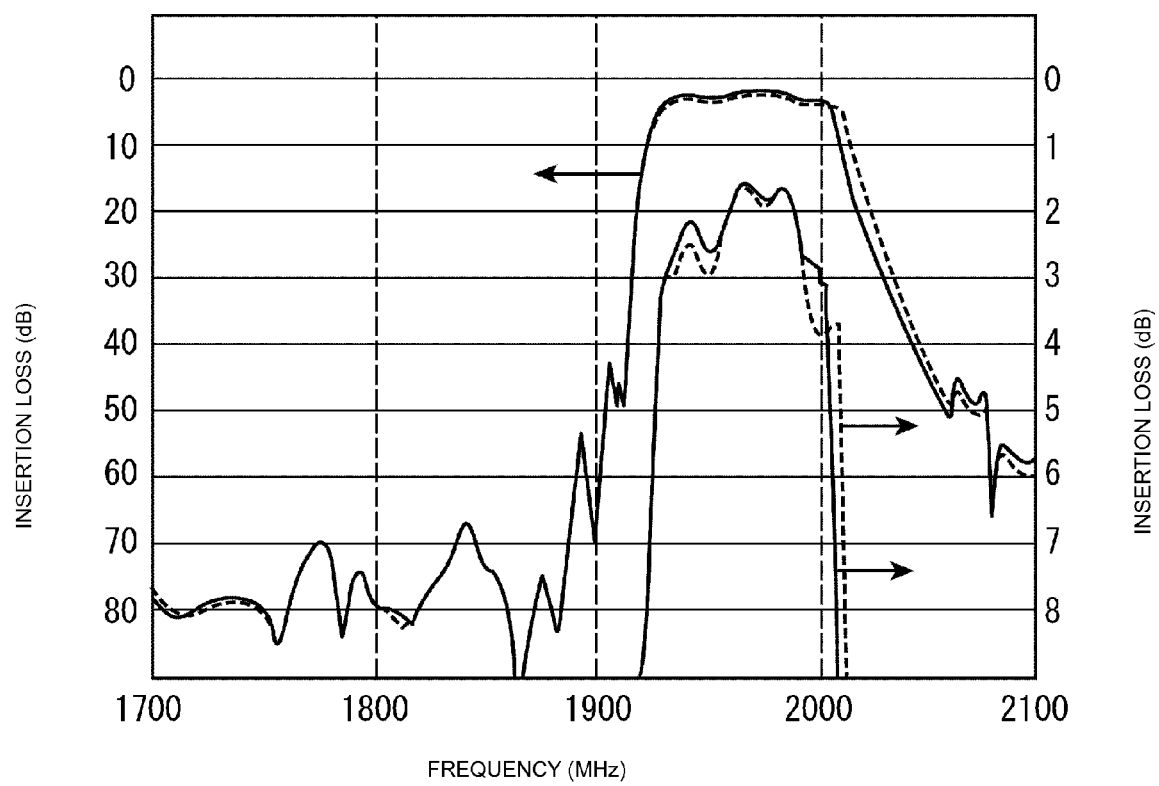
FIG. 3 is a graph showing a filter characteristic of the longitudinally coupled resonator SAW filter apparatus according to a preferred embodiment of the present invention and that of a longitudinally coupled resonator SAW filter apparatus according to a known technique.

FIG. 3 is a graph showing a filter characteristic of the longitudinally coupled resonator SAW filter apparatus 1 according to the present preferred embodiment (solid lines) and a filter characteristic of the comparative example, that is, the longitudinally coupled resonator SAW filter apparatus 601 (broken lines).

As shown in FIG. 3, the longitudinally coupled resonator SAW filter apparatus 1 according to the present preferred embodiment has a good filter characteristic similar to that achieved by the comparative example. In particular, the longitudinally coupled resonator SAW filter apparatus 1 according to the present preferred embodiment has a low insertion loss in a lower frequency range in the pass-band as compared to the comparative example, in spite of the reduction in the number of SAW filters. This good filter characteristic is achieved because the use of the single longitudinally coupled resonator SAW filter in the output area makes it possible to achieve a high impedance substantially equal to about 150 Ω in the output area, which is substantially 3 times that of the impedance in the input area.

In the present preferred embodiment, the number, N, of the first longitudinally coupled resonator SAW filters connected to the unbalanced signal terminal 3 is two (longitudinally coupled resonator SAW filters 6 and 7), that is, an even number of first longitudinally coupled resonator SAW filters are connected to the unbalanced signal terminal 3. In this structure, a first group includes up to N/2 first longitudinally coupled resonator SAW filters (the first group includes the longitudinally coupled resonator SAW filter 6 in this specific example), and a second group also includes up to N/2 first longitudinally coupled resonator SAW filters (the first group includes the longitudinally coupled resonator SAW filter 7 in this specific example). This highly symmetrical structure enables it to obtain good balance between the signal output from the first balanced signal terminal 4 and the signal output from the second balanced signal terminal 5, that is, a good balanced output signal is obtained. Note that in the present preferred embodiment and also in other preferred embodiments described below, of the total number, N, of the first longitudinally coupled resonator SAW filters, the number of first longitudinally coupled resonator SAW filters from which a signal propagates to the first balanced signal terminal may be different from the number of first longitudinally coupled resonator SAW filters from which a signal propagates to the second balanced signal terminal. Furthermore, an odd number of first longitudinally coupled resonator SAW filters may be connected to the unbalanced signal terminal 3.

Figure 4:
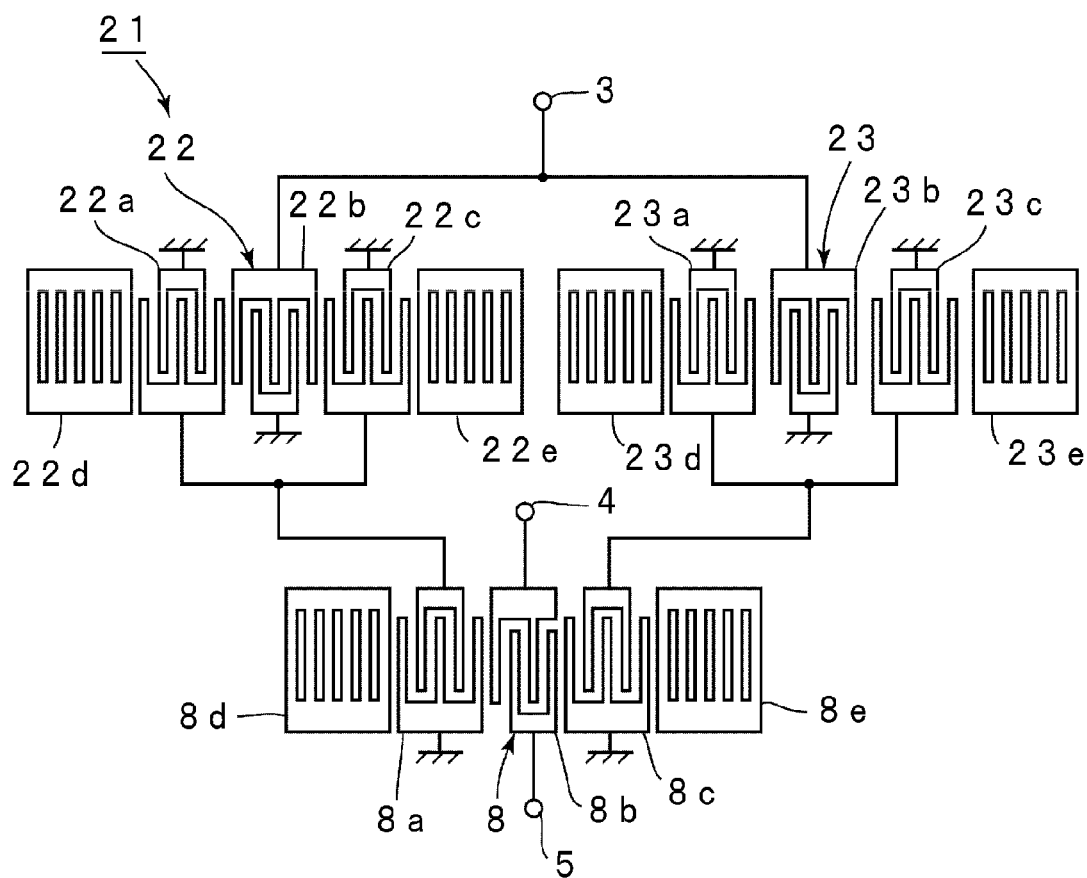
FIG. 4 is a plan view schematically showing an electrode structure of a longitudinally coupled resonator SAW filter apparatus according to a preferred embodiment of the present invention.

FIG. 4 is a plan view schematically showing an electrode structure of a longitudinally coupled resonator SAW filter apparatus according to a second preferred embodiment of the present invention.

The structure of the longitudinally coupled resonator SAW filter apparatus 21 according to the present preferred embodiment is similar to that of the longitudinally coupled resonator SAW filter apparatus 1 according to the first preferred embodiment described above except that the electrode structure of two first longitudinally coupled resonator SAW filters 22 and 23 is different from that used in the first preferred embodiment. In FIG. 4, similar parts to those shown in FIG. 1 are denoted by similar reference numerals, and a further explanation thereof is omitted herein.

The first longitudinally coupled resonator SAW filters 22 and 23 are preferably 3-IDT type longitudinally coupled resonator SAW filters, in which IDT-to-IDT gaps are designed such that the phase of a signal output from the first longitudinally coupled resonator SAW filter 22 and the phase of a signal output from the first longitudinally coupled resonator SAW filter 23 are different from each other by 180°. More specifically, the IDT-to-IDT gap, that is, the center-to-center distance between electrode fingers is greater by about 0.5λ (λ is the wavelength of the surface acoustic wave) for IDTs 23a to 23c of the longitudinally coupled resonator SAW filter 23 than for IDTs 22a to 22c of the longitudinally coupled resonator SAW filter 22. Thus, although the IDT 22b and 23b have the same polarity, a signal received by the IDT 22a and 22c is opposite in phase to a signal received by the IDT 23a and 23c.

That is, in this second preferred embodiment, to achieve the unbalanced-to-balanced conversion, the IDT-to-IDT gaps are adjusted so as to obtain the difference in the signal phase by 180° between the signals at the first and second balanced signal terminals.

Reflectors 22d and 22e are disposed on respective sides, in the direction of surface acoustic wave propagation, of an area in which IDTs 22a to 22c are disposed. The longitudinally coupled resonator SAW filter 23 also includes similar reflectors 23d and 23e.

Also in the second preferred embodiment, as in the first preferred embodiment, use of the two longitudinally coupled resonator SAW filters 22 and 23 as longitudinally coupled resonator SAW filters connected to the unbalanced signal terminal 3 enables it to achieve a high maximum allowable power, and use of the single second longitudinally coupled resonator SAW filter 8 enables it to achieve a small size.

Figure 5:
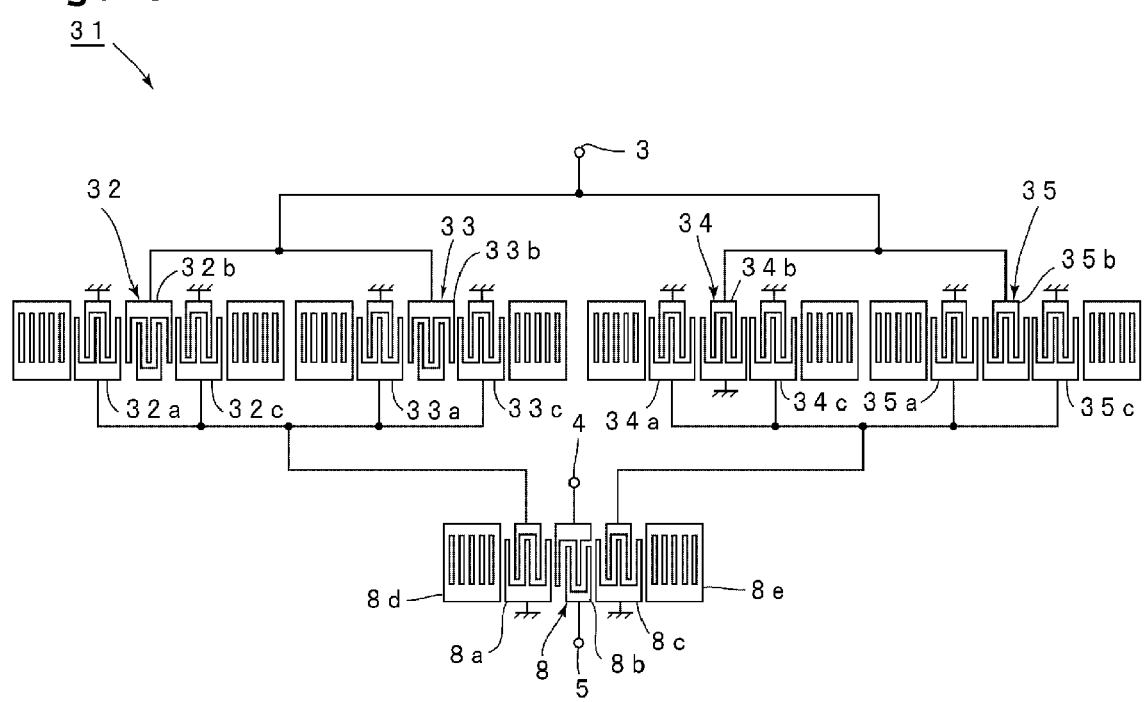
FIG. 5 is a plan view schematically showing an electrode structure of a longitudinally coupled resonator SAW filter apparatus according to a preferred embodiment of the present invention.

FIG. 5 is a plan view schematically showing an electrode structure of a longitudinally coupled resonator SAW filter apparatus according to a third preferred embodiment of the present invention.

The longitudinally coupled resonator SAW filter apparatus 31 according to the third preferred embodiment is similar to the longitudinally coupled resonator SAW filter apparatus 1 according to the first preferred embodiment except that four first longitudinally coupled resonator SAW filters 32, 33, 34, and 35 are provided. In FIG. 5, similar parts to those in the first preferred embodiment are denoted by similar reference numerals, and a further explanation thereof is omitted herein.

In the present preferred embodiment, four 3-IDT type longitudinally coupled resonator SAW filters 32 to 35 are preferably connected to the unbalanced signal terminal 3.

These four longitudinally coupled resonator SAW filters 32 to 35 are connected in a cascade arrangement to a second longitudinally coupled resonator SAW filter 8. Thus, in the present preferred embodiment, N=4 and M=1.

More specifically, the central IDTs 32b and 33b of the respective longitudinally coupled resonator SAW filters 32 and 33 are commonly connected to the unbalanced signal terminal 3. Similarly, the central IDTs 34b and 35b of the respective first longitudinally coupled resonator SAW filters 34 and 35 are commonly connected to the unbalanced signal terminal 3. On the other hand, the central IDTs 32b and 33b of the longitudinally coupled resonator SAW filters 32 and 33 are configured so as to have opposite polarities to the central IDTs 34b and 35b of the longitudinally coupled resonator SAW filters 34 and 35 so that a signal output from the longitudinally coupled resonator SAW filters 32 and 33 is different in phase by 180° from a signal output from the longitudinally coupled resonator SAW filters 34 and 35. Furthermore, the IDTs 32a, 32c, 33a, and 33c are commonly connected to one end of the IDT 8a of the second longitudinally coupled resonator SAW filter 8.

On the other hand, one end of each of the IDTs 34a and 34c and one end of each of IDTs 35a and 35c of the longitudinally coupled resonator SAW filters 34 and 35 are commonly connected to one end of the IDT 8c.

Thus, also in the present preferred embodiment, use of as many longitudinally coupled resonator SAW filters 32 to 35 as four as longitudinally coupled resonator SAW filters connected to the unbalanced signal terminal 3 defining the input terminal makes it possible to achieve a significant increase in the maximum allowable power.

On the other hand, in the area in which the first and second balanced signal terminals 4 and 5 defining output terminals are disposed, only one second longitudinally coupled resonator SAW filter 8 is used. Thus, the piezoelectric substrate size and the chip size are reduced.

Although in the present preferred embodiment, four (that is, an even number of) longitudinally coupled resonator SAW filters 32 to 35 are preferably connected to the unbalanced signal terminal 3, an odd number of (for example, three) longitudinally coupled resonator SAW filters may be connected in parallel to the unbalanced signal terminal 3.

The longitudinally coupled resonator SAW filters 32 to 35 may be configured such that signals output from these SAW filters have the same phase. In this case, the second longitudinally coupled resonator SAW filter is configured so that a signal supplied from the IDT 8a to the first balanced signal terminal 4 and a signal supplied from the IDT 8c to the second balanced signal terminal 5 are different in phase by 180°. This can be achieved by configuring the IDT 8a and the IDT 8c so as to have opposite polarities, or by setting the gaps such that the gap between the IDT 8a and the IDT 8b and the gap between the IDT 8b and the IDT 8c are different by about 0.5λ thereby obtaining a balanced output signal at the balanced signal terminals 4 and 5.

In the third preferred embodiment, the outputs of the IDTs 32a, 32c, 33a, and 33c may be connected to the other end of the IDT 8b, the outputs of the longitudinally coupled resonator SAW filters 34a, 34c, 35a, and 35c to the other end of the IDT 8b, and the first and second balanced signal terminals 4 and 5 to the IDTs 8a and 8c.

In the third preferred embodiment, the four longitudinally coupled resonator SAW filters 32 to 35 are preferably connected to the unbalanced signal terminal 3, and one longitudinally coupled resonator SAW filter 8 is preferably connected to the first and second balanced signal terminals 4 and 5 defining the output terminals. Alternatively, two or more second longitudinally coupled resonator SAW filters may be connected to the first and second balanced signal terminals 4 and 5 as long as N>M is satisfied.

Figure 6:
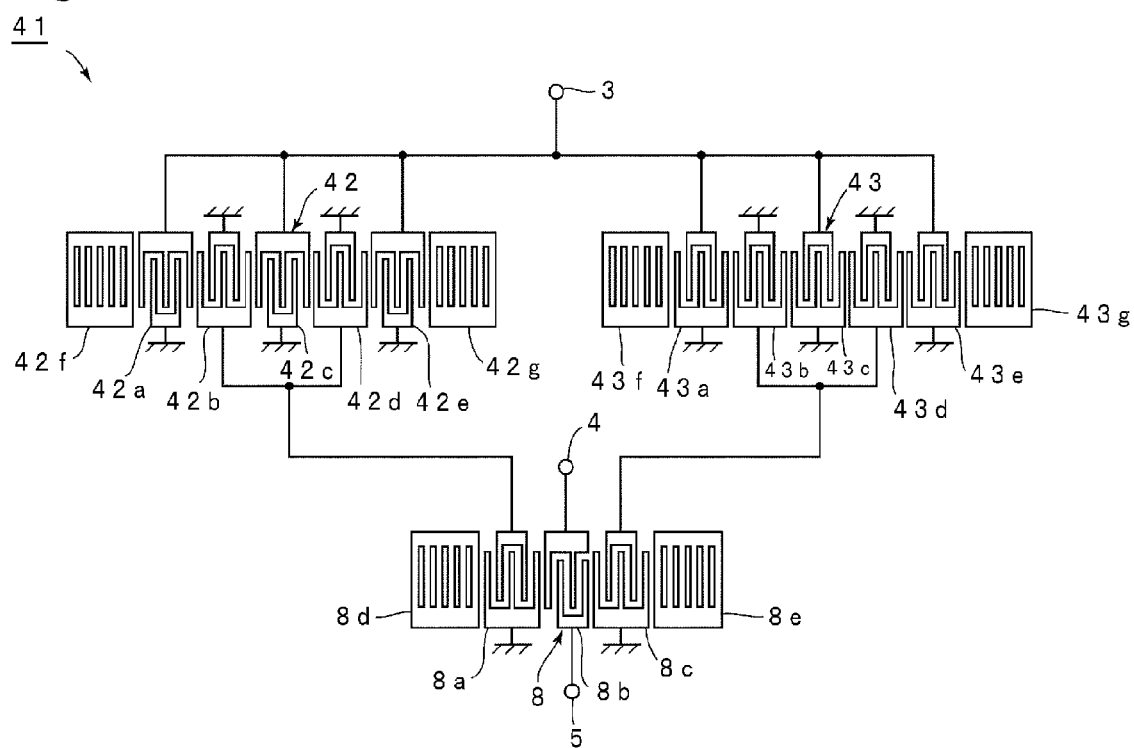
FIG. 6 is a plan view schematically showing an electrode structure of a longitudinally coupled resonator SAW filter apparatus according to a modified preferred embodiment of the present invention.

FIG. 6 is a plan view schematically showing an example of a modification of the longitudinally coupled resonator SAW filter apparatus according to the first preferred embodiment.

In this modification of the longitudinally coupled resonator SAW filter apparatus 41 shown in FIG. 6, the first longitudinally coupled resonator SAW filters 42 and 43 are preferably of the 5-IDT type instead of the 3-IDT type. The other parts are similar to those of the longitudinally coupled resonator SAW filter apparatus 1 according to the first preferred embodiment of the 3-IDT type.

The longitudinally coupled resonator SAW filter 42 preferably includes five IDTs 42a to 42e arranged in the direction of surface acoustic wave propagation. Reflectors 42f and 42g are disposed on respective sides of an area in which the IDTs 42a to 42e are disposed.

Similarly, the longitudinally coupled resonator SAW filter 43 includes five IDTs 43a to 43e and reflectors 43f and 43g.

One end of the central IDT 42c and one end of each of the IDTs 42a and 42e located at outermost locations are commonly connected to the unbalanced signal terminal 3. One end of each of the IDTs 42b and 42d located immediately adjacent to the IDT 42c are commonly connected to the second longitudinally coupled resonator SAW filter 8.

Similarly, in the longitudinally coupled resonator SAW filter 43, one end of the central IDT 43c and one end of each of the IDTs 43a and 43e located at outermost locations are commonly connected to the unbalanced signal terminal 3, and one end of each of the IDTs 43b and 43d is commonly connected to the second longitudinally coupled resonator SAW filter 8.

As described above, the first longitudinally coupled resonator SAW filter is not limited to the 3-IDT type, but a 5-IDT type longitudinally coupled resonator SAW filter may also be used. In this case, a greater number of IDTs enables a reduction in electric resistance of the elements, and thus, a further increase in the maximum allowable power is achieved.

Furthermore, the present modification enables a reduction in the number of first longitudinally coupled resonator SAW filters compared to the longitudinally coupled resonator SAW filter apparatus 31 according to the third preferred embodiment, and thus a reduction in the size is achieved.

Figure 7:
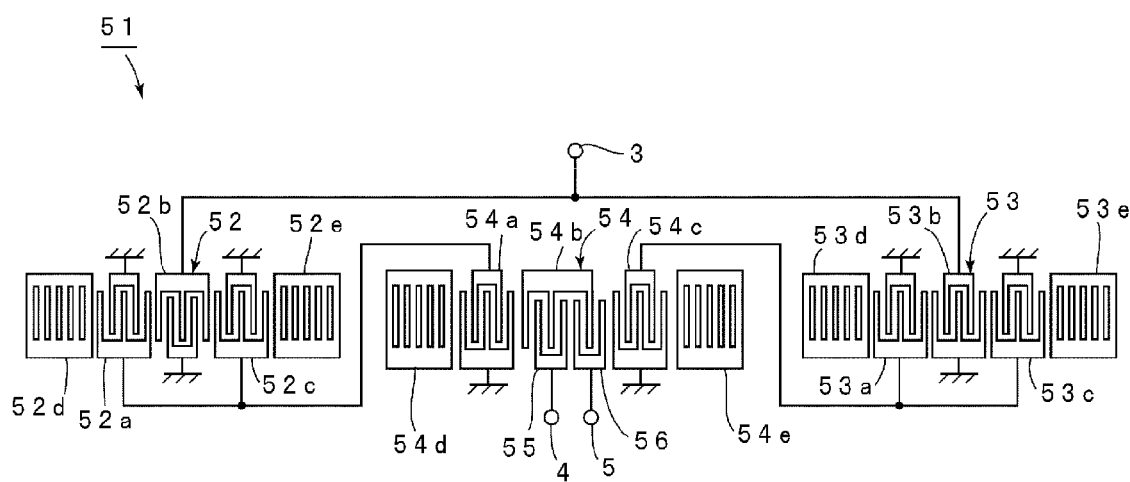
FIG. 7 is a plan view schematically showing an electrode structure of a longitudinally coupled resonator SAW filter apparatus according to a preferred embodiment of the present invention.

FIG. 7 is a plan view schematically showing an electrode structure of a longitudinally coupled resonator SAW filter apparatus according to a fourth preferred embodiment of the present invention.

In the longitudinally coupled resonator SAW filter apparatus 51 according to the fourth preferred embodiment, first longitudinally coupled resonator SAW filters 52 and 53 of the 3-IDT type are configured preferably to be identical in structure to each other and are connected to an unbalanced signal terminal 3. More specifically, central IDTs 52b and 53b of IDTs 52 and 53 are connected to the unbalanced signal terminal 3, and IDTs 52a, 52c, 53a, and 53c located at outer locations are connected to a longitudinally coupled resonator SAW filter 54. The longitudinally coupled resonator SAW filter 52 includes reflectors 52d and 52e, and the longitudinally coupled resonator SAW filter 53 includes reflectors 53d and 53e.

In the present preferred embodiment, the one second longitudinally coupled resonator SAW filter 54 is connected to the two first longitudinally coupled resonator SAW filters 52 and 53. Thus, in the present preferred embodiment, N=2 and M=1.

In the present preferred embodiment, the IDTs 52b and 53b are configured so as to have opposite polarities. Therefore, a signal output from the IDTs 52a and 52c and a signal output from the IDTs 53a and 53c are different in phase by 180°.

In the present preferred embodiment, the second longitudinally coupled resonator SAW filter 54 includes IDTs 54a, 54b, and 54c and reflectors 54d and 54e arranged in the direction of surface acoustic wave propagation. One end of the IDT 54a is connected to the first longitudinally coupled resonator SAW filter 52, and one end of the IDT 54c is connected to the longitudinally coupled resonator SAW filter 53.

The IDT 54b at the central location includes a first comb-shaped electrode and a second comb-shaped electrode whose fingers interdigitate with fingers of the first comb-shaped electrode. The second comb-shaped electrode is divided in the direction of surface acoustic wave propagation into two portions, that is, a first sub-IDT 55 and a second sub-IDT 56. The first sub-IDT 55 is connected to the first balanced signal terminal 4, and the second sub-IDT 56 is connected to the second balanced signal terminal 5.

That is, as described above, a balanced output signal is also obtained by configuring the second longitudinally coupled resonator SAW filter so as to have first and second sub-IDTs 55 and 56 which are respectively connected to the first and second balanced signal terminals 4 and 5.

Because the first and second sub-IDTs 55 and 56 are disposed on one side of the IDT 54b, first and second balanced signals can be output from the same side and thus it is possible to reduce an area in which signal terminals are provided. Thus, the present preferred embodiment allows a further reduction in the size.

Figure 8:
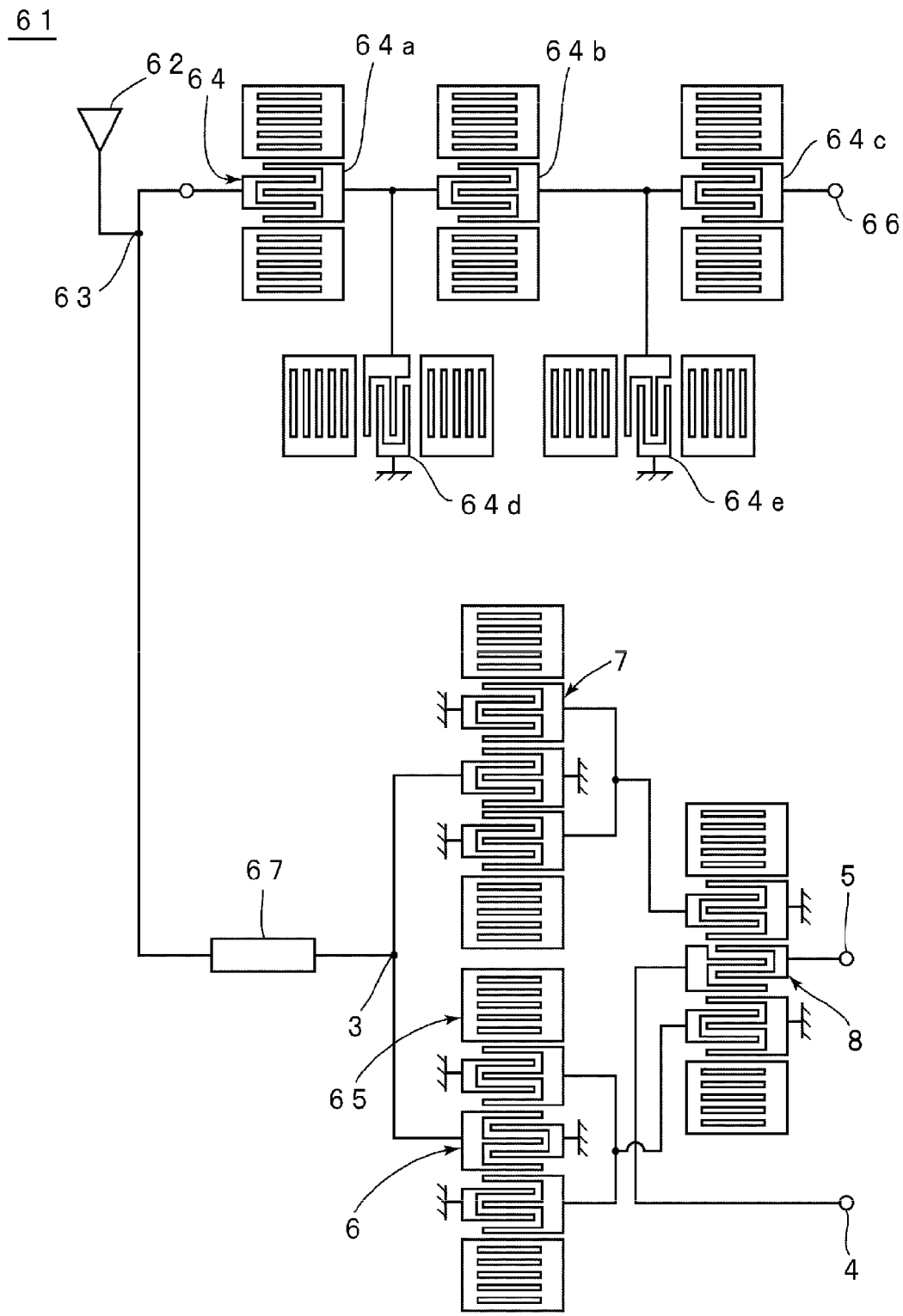
FIG. 8 is a plan view schematically showing a branching filter according to a preferred embodiment of the present invention.

FIG. 8 is a plan view schematically showing an electrode structure of a branching filter according to a fifth preferred embodiment of the present invention.

In this fifth preferred embodiment, a branching filter 61 includes an antenna terminal 63 for connection to an antenna 62. The antenna terminal 63 is connected to a transmitting filter apparatus 64 and a receiving filter apparatus 65. As shown in FIG. 8, the transmitting filter apparatus 64 is preferably a ladder type surface acoustic wave filter apparatus including a plurality of serial-arm resonators 64a to 64c and a plurality of parallel-arm resonators 64d and 64e which are connected in a ladder circuit arrangement. An end of the filter apparatus 64, opposite to the antenna terminal 63, is connected to a transmitting terminal 66.

On the other hand, the receiving filter apparatus 65 includes an unbalanced signal terminal 3 connected to the antenna terminal 63 via a matching circuit 67 and first and second balanced signal terminals 4 and 5 defining receiving terminals. In the receiving filter apparatus 65, a longitudinally coupled resonator SAW filter apparatus 1 according to the first preferred embodiment is connected between the unbalanced signal terminal 3 and the balanced signal terminals 4 and 5.

Thus, in the branching filter 61, the receiving filter apparatus 65 is arranged so as to have a high maximum allowable power without increasing the size, and thus, it is possible to achieve a small-sized branching filter 61 with high maximum allowable power.

Although in the branching filter 61 according to the present preferred embodiment, the longitudinally coupled resonator SAW filter apparatus 1 according to the first preferred embodiment is used in the receiving filter apparatus 65, a longitudinally coupled resonator SAW filter apparatus having an unbalanced-to-balanced conversion function according to one of the second to fourth preferred embodiment or the modified preferred embodiment of the present invention may also be used in the receiving filter apparatus 65.

Figure 9:
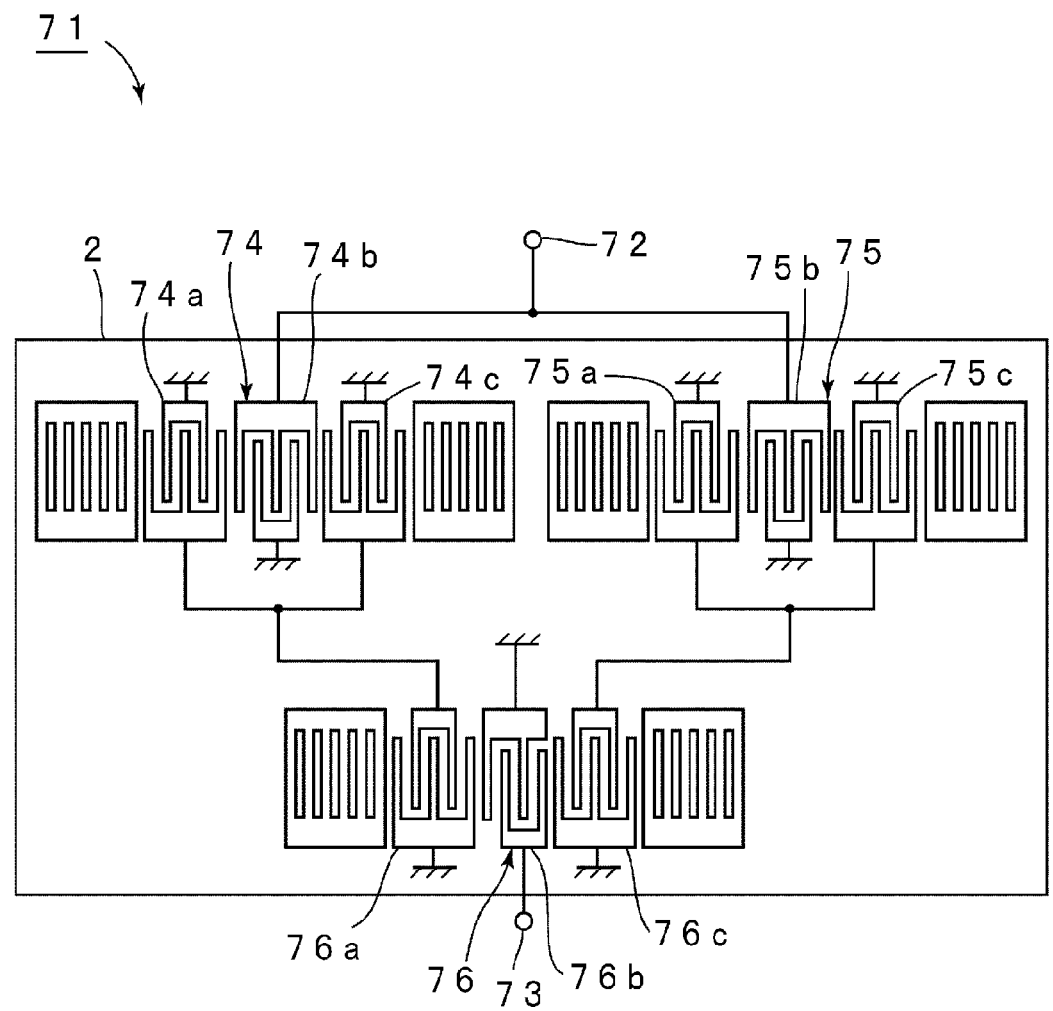
FIG. 9 is a plan view schematically showing an electrode structure of a longitudinally coupled resonator SAW filter apparatus according to a preferred embodiment of the present invention.
Figure 10:
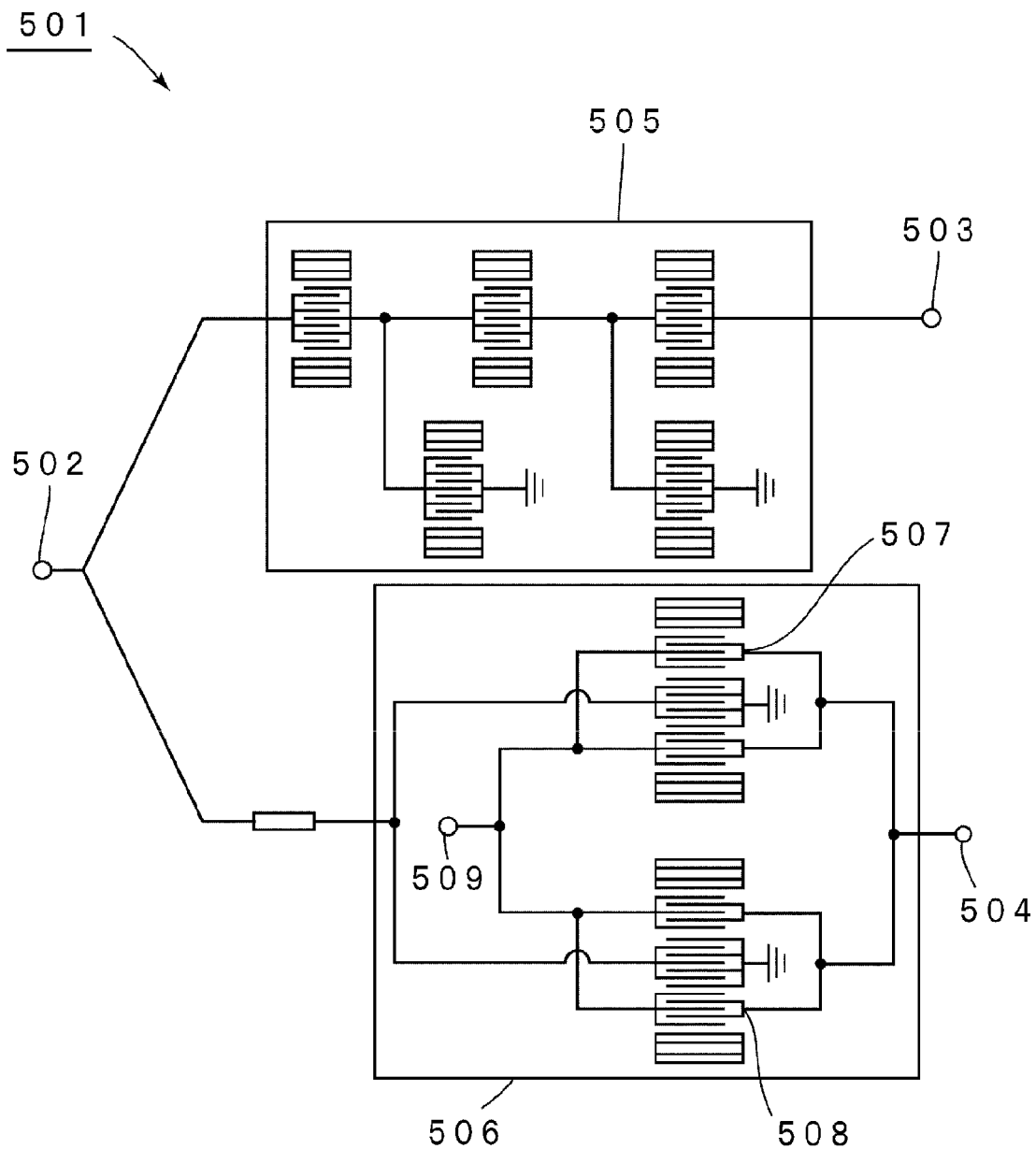
FIG. 10 is a plan view schematically showing an example of a circuit configuration of a longitudinally coupled resonator SAW filter apparatus according to a known technique.
Figure 11:
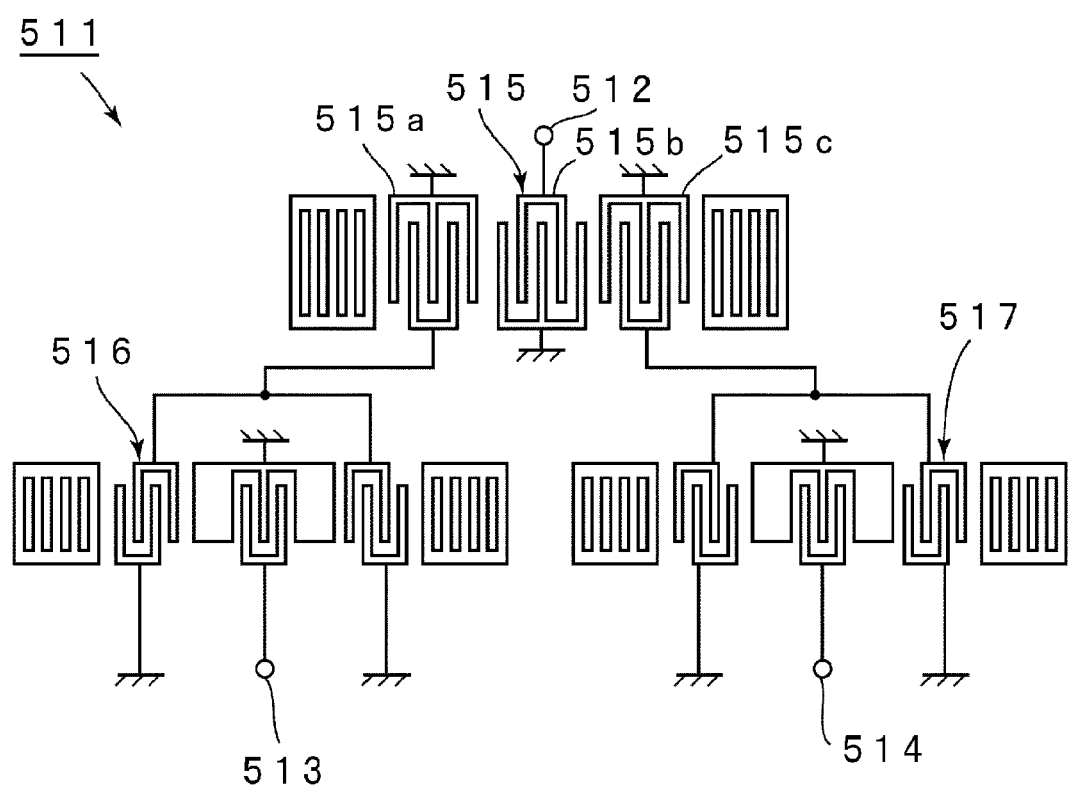
FIG. 11 is a plan view schematically showing an electrode structure of a longitudinally coupled resonator SAW filter apparatus according to a known technique.

FIG. 9 is a plan view schematically showing an electrode structure of a longitudinally coupled resonator SAW filter apparatus according to a sixth preferred embodiment of the present invention.

In this sixth preferred embodiment, a longitudinally coupled resonator SAW filter apparatus 71 includes a plurality of first longitudinally coupled resonator SAW filters 74 and 75 and a second longitudinally coupled resonator SAW filter 76, which are connected between an input terminal 72 and an output terminal 73. In the present preferred embodiment, when the number of first longitudinally coupled resonator SAW filters (longitudinally coupled resonator SAW filters 74 and 75 in the present example) is denoted by N (N is an integer equal to or greater than 2), and the number of second longitudinally coupled resonator SAW filters (longitudinally coupled resonator SAW filter 76 in the present example) is denoted by M (M is an integer equal to or greater than 1), N and M are selected such that N>M. The second longitudinally coupled resonator SAW filter 76 is connected in a cascade arrangement to the first longitudinally coupled resonator SAW filters 74 and 75. The longitudinally coupled resonator SAW filter apparatus 71 according to the present preferred embodiment is similar to the longitudinally coupled resonator SAW filter apparatus 1 according to the first preferred embodiment except that the unbalanced-to-balanced conversion function is not provided.

More specifically, IDTs 74a to 74c are provided so as to be identical in structure to IDTs 75a to 75c, one end of the IDT 76a of the second longitudinally coupled resonator SAW filter 76 is connected to the IDTs 74a and 74c, and one end of the IDT 76c of the second longitudinally coupled resonator SAW filter 76 is connected to the IDT 75a and 75c. One end of the IDT 76b at the central location is connected to the output terminal 73, and the other end thereof is grounded.

As described above, the present invention can also be applied to a filter apparatus which has one input terminal (the input terminal 72 in the above-described example) and one output terminal (the output terminal 73 in the above-described example) and which thus does not have an unbalanced-to-balanced conversion function. Also in this configuration, use of the N longitudinally coupled resonator SAW filters (the longitudinally coupled resonator SAW filters 74 and 75 in the above example) connected to the input terminal 72 enables an increase in the maximum allowable power. In addition, use of a smaller number of M longitudinally coupled resonator SAW filters (the M longitudinally coupled resonator SAW filters) connected to the output terminal 73 enables a reduction in the size.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A surface acoustic wave filter apparatus comprising:
   a piezoelectric substrate;
   N first longitudinally coupled resonator SAW filters, where N is an integer equal to or greater than 2, each including at least two IDTs disposed on the piezoelectric substrate in a direction in which a surface acoustic wave propagates and a pair of reflectors disposed on two respective sides, in the direction in which the surface acoustic wave propagates, of an area in which the at least two IDTs are disposed; and
   M second longitudinally coupled resonator SAW filters, where M is an integer equal to or greater than 1, each including at least two IDTs disposed on the piezoelectric substrate in the direction in which the surface acoustic wave propagates and a pair of reflectors disposed on two respective sides, in the direction in which the surface acoustic wave propagates, of an area in which the at least two IDTs are disposed; wherein
   the first longitudinally coupled resonator SAW filters are connected in a cascade arrangement to the second longitudinally coupled resonator SAW filters;
   the surface acoustic wave filter apparatus further comprises an unbalanced signal terminal and first and second balanced signal terminals;
   one end of each of the N first longitudinally coupled resonator SAW filters is connected to the unbalanced signal terminal;
   one end of each of the M second longitudinally coupled resonator SAW filters is connected to the first balanced signal terminal;
   the other end of each of the M second longitudinally coupled resonator SAW filters is connected to the second balanced signal terminal; and
   N and M are selected such that N>M.

2. The surface acoustic wave filter apparatus according to claim 1, wherein the surface acoustic wave filter apparatus is a receiving filter in a branching filter.

3. The surface acoustic wave filter apparatus according to claim 1, wherein
   N is an even number, and the first longitudinally coupled resonator SAW filters includes a first group including N/2 longitudinally coupled resonator SAW filters and a second group including N/2 longitudinally coupled resonator SAW filters;
   the phase of a signal output from the longitudinally coupled resonator SAW filter in the first group with respect to the phase of an input signal and the phase of a signal output from the longitudinally coupled resonator SAW filter in the second group with respect to the phase of an input signal are different by 180°; and
   M is 1, and the second longitudinally coupled resonator SAW filter has first and second input nodes, the first input node being connected to an output node of the first group of longitudinally coupled resonator SAW filters, the second input node being connected to an output node of the second group of longitudinally coupled resonator SAW filters.

4. The surface acoustic wave filter apparatus according to claim 1, wherein
   each second longitudinally coupled resonator SAW filter includes three IDTs, and, of the three IDTs, an IDT located at a central location is divided, in the direction in which the surface acoustic wave propagates, into first and second sub-IDTs; and
   one end of the first sub-IDT is electrically connected to one end of the second sub-IDT, the other end of the first sub-IDT is connected to the first balanced signal terminal, and the other end of the second sub-IDT is connected to the second balanced signal terminal.

5. The surface acoustic wave filter apparatus according to claim 1, wherein N is equal to or greater than 4.

6. The surface acoustic wave filter apparatus according to claim 1, wherein each of the first longitudinally coupled resonator SAW filters includes five IDTs.

7. A branching filter including a receiving filter defined by a surface acoustic wave filter apparatus according to claim 1.

8. The surface acoustic wave filter apparatus comprising
   a piezoelectric substrate;
   N first longitudinally coupled resonator SAW filters, where N is an integer equal to or greater than 2, each including at least two IDTs disposed on the piezoelectric substrate in a direction in which a surface acoustic wave propagates and a pair of reflectors disposed on two respective two sides, in the direction in which the surface acoustic wave propagates, of an area in which the at least two IDTs are disposed; and
   M second longitudinally coupled resonator SAW filters, where M is an integer equal to or greater than 1, each including at least two IDTs disposed on the piezoelectric substrate in the direction in which the surface acoustic wave propagates and a pair of reflectors disposed on two respective two sides, in the direction in which the surface acoustic wave propagates, of an area in which the at least two IDTs are disposed; wherein
   the first longitudinally coupled resonator SAW filters are connected in a cascade arrangement to the second longitudinally coupled resonator SAW filter;
   the surface acoustic wave filter apparatus further comprises an input signal terminal and an output signal terminal;
   the first longitudinally coupled resonator SAW filters are connected to the input signal terminal;
   the second longitudinally coupled resonator SAW filters are connected to the output signal terminal; and
   N and M are selected such that N>M.

9. The surface acoustic wave filter apparatus according to claim 8, wherein the surface acoustic wave filter apparatus is a receiving filter in a branching filter.

10. The surface acoustic wave filter apparatus according to claim 8, wherein N is equal to or greater than 4.

11. The surface acoustic wave filter apparatus according to claim 1, wherein each of the first longitudinally coupled resonator SAW filters includes five IDTs.

12. A branching filter including a receiving filter defined by a surface acoustic wave filter apparatus according to claim 8.

* * * * *